United States Patent
Balschun

(10) Patent No.: US 11,978,618 B2
(45) Date of Patent: May 7, 2024

(54) MANUFACTURING METHOD FOR AN ION GUIDE

(71) Applicant: Thermo Fisher Scientific (Bremen) GmbH, Bremen (DE)

(72) Inventor: Wilko Balschun, Bremen (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 140 days.

(21) Appl. No.: 17/556,841

(22) Filed: Dec. 20, 2021

(65) Prior Publication Data

US 2022/0199388 A1 Jun. 23, 2022

(30) Foreign Application Priority Data

Dec. 22, 2020 (GB) ..................... 2020381

(51) Int. Cl.
*H01J 49/06* (2006.01)
*H01J 49/00* (2006.01)
*H05K 13/06* (2006.01)

(52) U.S. Cl.
CPC ........ *H01J 49/065* (2013.01); *H01J 49/0031* (2013.01); *H05K 13/06* (2013.01)

(58) Field of Classification Search
CPC .... H01J 49/065; H01J 49/0031; H01J 49/062; H01J 49/4255; H01J 49/068; H01J 49/063; H01J 49/06; H01J 49/061; H01J 49/26; H05K 13/06
USPC ........................................................ 250/290
See application file for complete search history.

(56) References Cited

U.S. PATENT DOCUMENTS

| | | | |
|---|---|---|---|
| 7,829,850 | B2 | 11/2010 | Kovtoun |
| 2003/0178564 | A1 | 9/2003 | Kernan et al. |
| 2007/0114391 | A1 | 5/2007 | Mordehai et al. |
| 2011/0100960 | A1 | 5/2011 | Rebettge |

(Continued)

FOREIGN PATENT DOCUMENTS

| | | |
|---|---|---|
| EP | 2804201 | 11/2014 |
| GB | 2392005 | 2/2004 |
| WO | 2017194974 | 11/2017 |

OTHER PUBLICATIONS

Ignacio A Zuleta et al., Micromachined Bradbury-Nielsen Gates, Analytical Chemistry, vol. 79, 2007, pp. 9160-9165.

(Continued)

*Primary Examiner* — Kiet T Nguyen

(57) ABSTRACT

A component of an ion optical device is manufactured. The component comprises aligned first and second electrode sets. A first material is machined to provide a part-machined first electrode set that comprises the first electrode set attached to a frame part of the first material. A second material is machined to provide a part-machined second electrode set that comprises the second electrode set attached to a frame part of the second material. The component of the ion optical device is assembled by aligning the part-machined first and second electrode sets. Subsequent to aligning the part-machined first and second electrode sets, the part-machined first electrode set is further machined to separate the first electrode set from the frame part of the first material and the part-machined second electrode set is further machined to separate the second electrode set from the frame part of the second material.

17 Claims, 19 Drawing Sheets

(56) References Cited

U.S. PATENT DOCUMENTS

2014/0087063 A1* 3/2014 Mu .................. C23C 14/34
  427/98.5
2021/0183634 A1* 6/2021 Gill .................. H01J 49/063

OTHER PUBLICATIONS

UKIPO Search Report dated Oct. 7, 2021, for Application No. GB2020381.6.

* cited by examiner

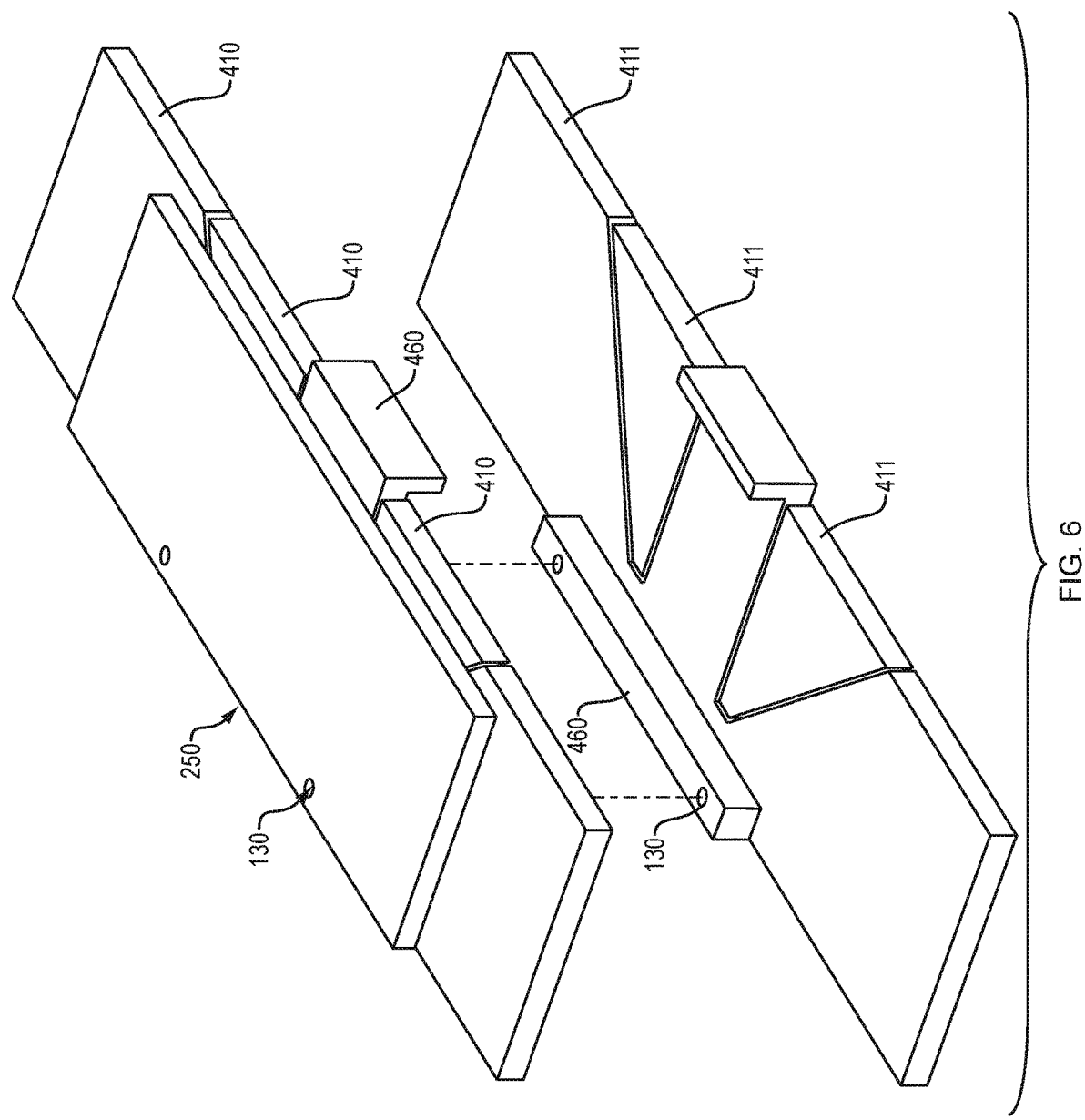

MANUFACTURING METHOD FOR AN ION GUIDE

FIELD OF THE INVENTION

The present disclosure relates to a method for manufacturing a component of an ion optical device, particularly for use in a mass spectrometer.

BACKGROUND OF THE INVENTION

Ion optics control the formation, focusing and deflection of ion beams using electric and magnetic fields. Ion optics may include ion guides, ion storage devices, ion deflectors, ion analysis devices and other ion manipulation devices known in this field. Ion guides are used to transport ions. For example, in mass spectrometry, ion guides may be used to transport ions from an ion source to an ion analyser.

U.S. Pat. No. 7,829,850 describes a branched radio frequency (RF) multipole configured to act as an ion guide. The branched multipole comprises multiple ion channels through which ions can be alternatively directed. The branched multipole is configured to control which of the multipole ion channels ions are directed through the application of an RF potential.

GB 2392005 relates to a mass spectrometer ion guide comprising a plurality of plate electrodes, an upper plate electrode and a lower plate electrode arranged in the plane of ion travel. One or more channels are formed within the plate electrodes so that an ion guiding region is formed within the ion guide.

WO 2017/194974 concerns an ion guide comprising a plurality of axially stacked plates, each plate comprising a pair of interleaved electrodes. The electrodes are mounted in a housing to hold the electrodes in their axial position.

Conventional methods of manufacturing ion guides, for instance those discussed above, involve machining (for example, by milling or erosion) single parts and mounting the parts together using conventional alignment elements, such as dowels. With these methods, it is difficult to align elements reliably, with high accuracy or provide consistent controlled conditions when such ion guides are used as part of an analytical instrument.

Therefore, there is required a method for manufacturing a component of an ion optical device that overcomes these problems.

SUMMARY OF THE INVENTION

According to the present disclosure, there is provided a method of manufacturing a component of an ion optical device.

The method advantageously comprises an initial step of machining a material to provide a part-machined electrode set that comprises the electrode set attached to a frame part of the material prior to aligning electrode sets of the component. Following a step of aligning the electrode sets, a step of further machining the part-machined electrode set separates the electrode set from the frame part of the material.

Performing the steps in such an order advantageously allows electrode sets to be aligned with high accuracy and consistency. The method disclosed herein may allow an assembly to be built with an accuracy of ±25 µm in dimension, flatness and parallelism. Furthermore, more complex components (for example, involving a greater number of electrode sets or comprising electrode sets with complex shapes that are more difficult to align using conventional methods) can be manufactured, whilst maintaining the aforementioned high accuracy and consistency. This high accuracy and consistency also allows for consistent controlled conditions in an analytical instrument.

The steps of further machining may be performed simultaneously. The high accuracy and consistency of alignment of the electrode sets may thereby be maintained.

The steps of machining and/or further machining may be performed by wire-erosion. Wire-erosion advantageously allows accurate machining of electrode sets, which may be complex in shape. When the steps or machining and/or further machining are performed by wire-erosion, a wire for the wire-erosion has a cutting direction in which a cut of the machining takes place and the wire is preferably at an angle to a plane perpendicular to the cutting direction of no more than 15 degrees. Edges of the electrode sets may thereby be slanted at a small angle. Optionally, the angle is 0 degrees. The edges of the electrode sets may thereby be planar.

Optionally, the first electrode set comprises a first electrode. Optionally, the first electrode set comprises a first plurality of electrodes. In the case where the first electrode set comprises a first plurality of electrodes, highly accurate and consistent alignment between many electrodes, which may be complex in shape or construction. Such levels of accuracy may be difficult to achieve consistently using conventional methods.

Optionally, the second electrode set comprises a second electrode. Optionally, the second electrode set comprises a second plurality of electrodes. The same advantages as described in relation to the first plurality of electrodes can be provided.

The step of machining a first material may include machining shaping features to provide a segmented electrode set following the further machining step. In this way, more complex electrode sets may be provided whilst maintaining the high accuracy alignment of electrode sets that may be provided by the disclosure herein.

The step of machining a second material may include machining shaping features to provide a segmented electrode set following the further machining step. More complex electrode sets may thereby be provided whilst maintaining the high accuracy alignment can be provided by the disclosure herein. Machining the second material to provide shaping features may be in addition to or as an alternative to machining a first material to provide shaping features.

The first and second materials may be the same material.

The component of the ion optical device may be an ion guide or an ion deflector. Optionally, the ion guide is more specifically a Y-shaped multipole. Other ion guide types may be provided.

The part-machined first and second electrode sets may be aligned using dowels and/or guide pins. This allows the electrode sets to be conveniently aligned with high accuracy.

Guide holes for the dowels and/or guide pins may be provided during the steps of machining. Machining the guide holes during the step of machining allows high accuracy and consistent alignment of the electrode sets during the step of aligning.

The steps of further machining may include machining an outer alignment feature for aligning the component to an external holder. Advantageously, the outer alignment feature may allow the component to be aligned to an external holder with higher accuracy than using conventional methods. The external holder may be, for example, an ion optical bench or chamber system. Normally, alignment to an external holder is done by using further guide pins and/or supports, which adds a further step in which the accuracy of alignment may be reduced. The accuracy of alignment in the present disclosure may be ±0.01 mm.

Optionally, prior to the step of assembling the component, the first electrode set is glued to a printed circuit board, PCB; and/or the second electrode set is glued to a PCB. The PCBs may thereby be well aligned with the electrode sets, improving the alignment of the final component assembly.

BRIEF DESCRIPTION OF THE DRAWINGS

The present invention may be put into practice in a number of ways and embodiments will now be described by way of example only and with reference to the accompanying drawings, in which:

FIG. 6 illustrates an exploded view of the ion deflector in FIG. 5;

It should be noted that the Figures are illustrated for simplicity and are not necessarily drawn to scale. Like features are provided with the same reference numerals.

DETAILED DESCRIPTION

The present disclosure provides a method for manufacturing a component of an ion optical device. The component may be the ion optical device itself or a part of the optical device.

A sheet of material may be used to manufacture a component of an ion optical device. The material may be stainless steel. Alternatively, the material may be alloy 36 (Invar® 36), a nickel-iron alloy containing 36% nickel. Alloy 36 has a very low thermal expansion coefficient and provides high dimensional stability. Alloy 36 is also magnetic and so a magnetic clamping chuck can be used to hold the material in place during machining and/or further machining steps.

Figure 1:
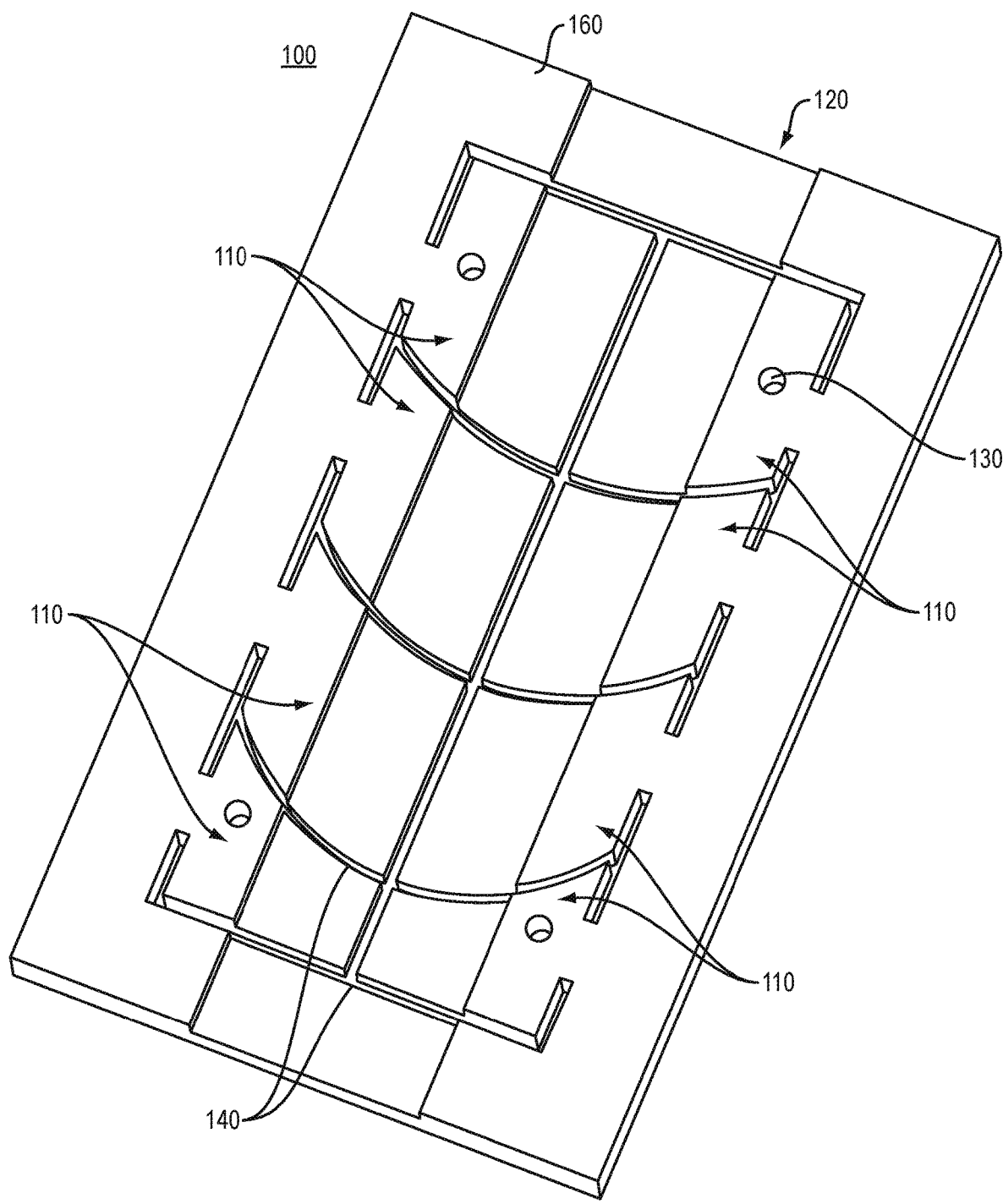
FIG. 1 illustrates a perspective view of a part-machined electrode set for an ion guide according to the present disclosure.

With reference to FIG. 1, there is shown a part-machined electrode set 100 for an ion guide manufactured from the material following a first machining step. This comprises: a first electrode set 110; and a frame part 120. The frame part 120 may also be referred to as a frame 120. The first machining step may be performed by wire-erosion and/or milling.

As shown in FIG. 1, the part-machined electrode set 100 comprises a first electrode set 110 attached to a frame part 120 of a first material. The material may be stainless steel or alloy 36. The part-machined electrode set 100 may be flat or may include one or more ridges. The electrode set 110 shown in FIG. 1 comprises a plurality of electrodes, but it will be appreciated that the electrode set 110 may comprise one electrode.

The part-machined electrode set 100 includes guide holes 130 for assembling the ion guide, which may be machined using wire-erosion. The guide holes 130 are provided in the first electrode set 110. The guide holes may be provided in each electrode of the electrode set 110 (which may be one electrode or may be a plurality of electrodes) or may be provided in only some electrodes of the electrode set 110. The guide holes 130 may be machined at the same time as performing the first machining step. This improves the accuracy of alignment of a fully assembled component.

The part-machined electrode set 100 may also include shaping features 140 (also referred to as machined features 140) to provide a segmented and/or shaped electrode set 110 following a further machining step. The further machining step may thereby split or segment electrodes in the electrode set 110 that were connected via the frame part 120. In the example shown in FIG. 1, machined features provide a segmented and shaped (curved) electrodes following a further machining step. It should be appreciated that the electrodes need not be curved, but may be rectangular in shape, for example.

The method may involve machining one or more materials to provide further part-machined electrode sets 100. For example, a second material may be machined to provide a second part-machined electrode set 100 comprising a second electrode set 110 attached to a frame part 120 of the second material. The second material may be the same as the first material.

Figure 2:
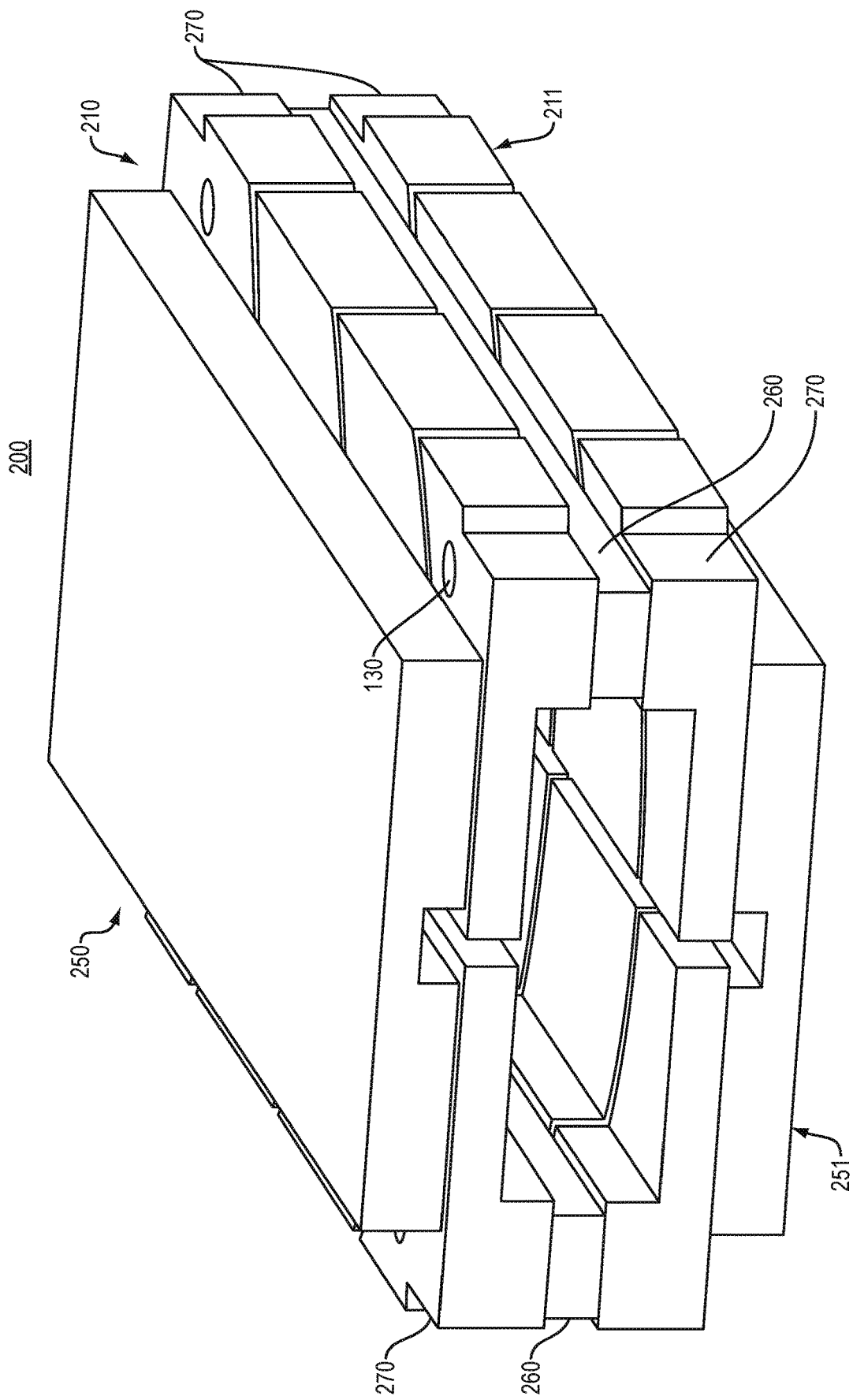
FIG. 2 shows a perspective view of aligned part-machined electrode sets manufactured according to the present disclosure.

FIG. 2 shows aligned first and second electrode sets 210, 211 machined according to the embodiment shown in FIG. 1 following steps of further machining. It should be noted that the steps of further machining may also be referred to as a step, or as "step(s)" of further machining.

The second electrode set 211 may be machined from the same material as the first electrode set 210 (i.e. the first and second materials may be the same). A first step of further machining separates the first part-machined electrode set 100 from the frame part 120 of the first material and a second step separates the second part-machined electrode set 100 from a frame part 120 of a second material. The steps of further machining may be performed simultaneously.

The aligned first and second electrode sets 210, 211 may be for an ion guide. The first and second electrode sets 210, 211 may also be termed a top electrode set 210 and bottom electrode set 211.

The first and second electrode sets 210, 211 are aligned using aligning holes 130 prior to the step of further machining. Each or either of the first and second electrode sets 210, 211 may be glued to a PCB 250 prior to or after aligning the first and second electrode sets 210, 211. In the embodiment where the first and/or second electrode sets 210, 211 are glued to PCBs 250, 251, alignment holes 130 (guide holes 130) are provided in the PCB (not visible). The PCB 250, 251 may be made from an RF laminate, for example, Megtron 6 material, and may be shaped and slotted to correspond to the shape and machined features of the electrode set 210, 211 to which it is glued.

In the embodiment shown in FIG. 2, a first PCB 250 is shown glued to the upper surface of the first electrode set 210 and a second PCB 251 is shown glued to a lower surface of the second electrode set 211. An insulator 260 may be provided between the electrode sets to define the height of an ion channel. The insulator 260 may be provided on one of the electrode sets 210, 211 prior to the step of aligning the electrode sets 210, 211.

The steps of further machining step may also include machining an outer alignment feature 270 or outer alignment surface 270. The outer alignment feature 270 may be used to align the assembled component 200 (an ion guide in FIG. 2) to an external holder. The external holder may be, for example, an ion optical bench or chamber system. Advantageously, the outer alignment feature 270 allows the component 200 to be aligned to the external holder with higher accuracy than using conventional methods. Normally, alignment to an external holder is done by using further guide pins and/or supports. The accuracy of alignment in the present disclosure may be ±0.01 mm.

As described with reference to FIG. 1, the method may involve machining one or more materials to provide further electrode sets 210, 211. For example, a second material may be machined to provide a second part-machined electrode set 100 comprising a second electrode set 210, 211 attached to a frame part 120 of the second material. The second material may be the same as the first material.

Figure 3:
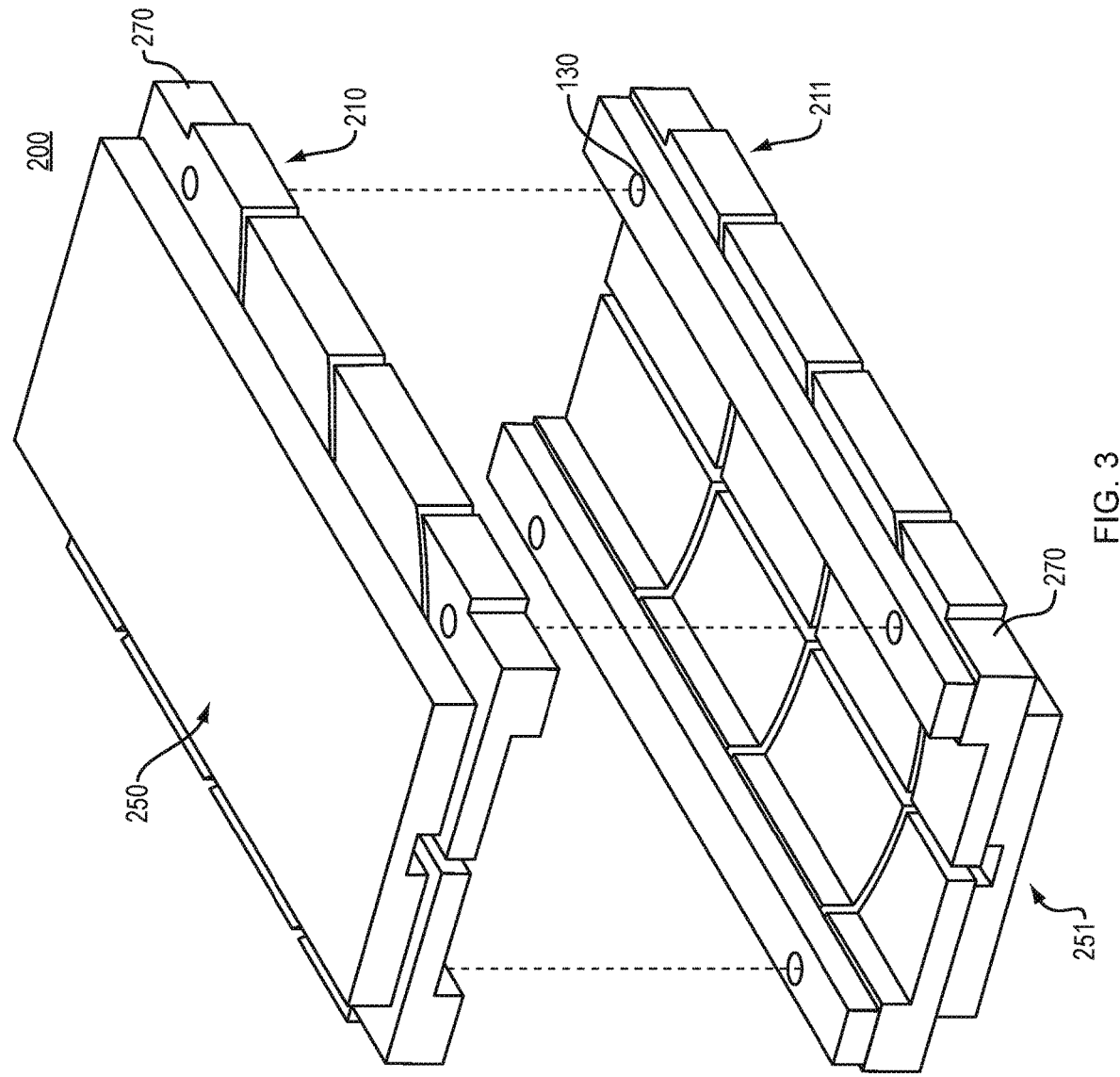
FIG. 3 illustrates an exploded view of the ion guide in FIG. 2.

FIG. 3 shows an exploded view of the aligned electrode sets 200 shown in FIG. 2. This Figure illustrates more clearly how the first and second electrode sets 200 are aligned using alignment holes 130. Alignment holes 130 are provided in the insulator 260 to allow alignment of the first and second part-machined electrode sets 100, for example, using dowels or guide pins (not visible).

Figure 4:
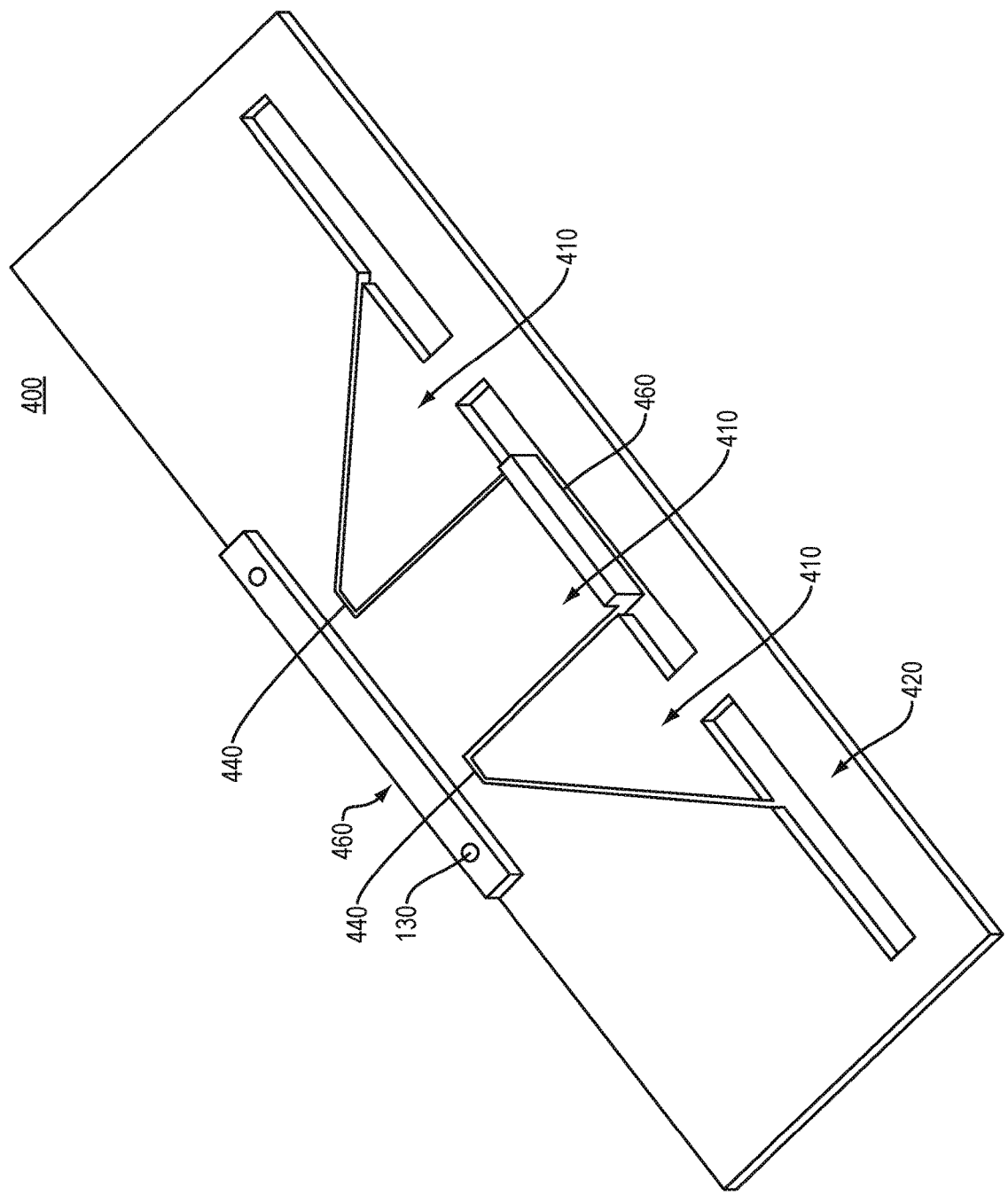
FIG. 4 illustrates a perspective view of a part-machined electrode set for an ion deflector.

With reference to FIG. 4, there is shown a part-machined electrode set 400 for an ion deflector. The part-machined electrode set 400 comprises an electrode set 410 attached to a frame part 420 of a material. The material may be stainless steel or alloy 36. The electrode set 410 shown in FIG. 4 comprises a plurality of electrodes, but it will be appreciated that the electrode set 410 may comprise one electrode. The part-machined electrode set 400 may be flat or may include one or more ridges 460. The one or more ridges may separate first and second electrode sets 410, 411 by a pre-determined distance when assembled.

The part-machined electrode set 400 includes guide holes 130 for assembling the ion guide, which may be machined using wire-erosion. The guide holes may be provided in only some electrodes of the electrode set 410. The guide holes 130 may be machined at the same time as performing the first machining step.

The part-machined electrode set 400 may also include shaping features 440 to provide a segmented and/or shaped electrode set following a further machining step. The further machining step may therefore split or segment electrodes 410 in the electrode set 410 that were connected via the frame part 420. In the example shown in FIG. 4, machined features 440 provide a segmented and shaped (trapezoid prism) electrode set 410 following a further machining step. The trapezoid may be substantially triangular in shape. For example, the trapezoid may be a triangle with one (or more than one) truncated vertex.

Figure 5:
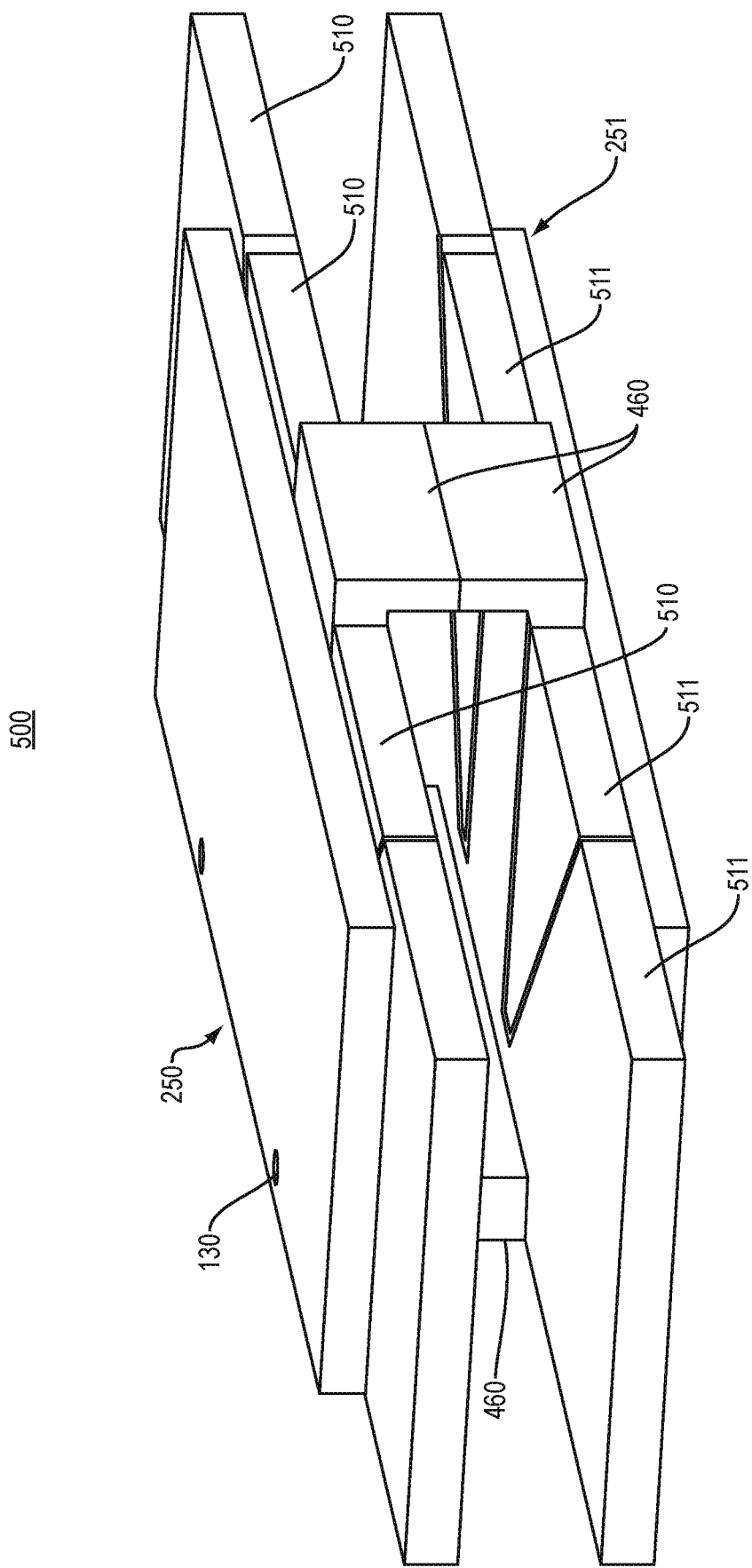
FIG. 5 illustrates a perspective view of an ion deflector manufactured according to the present disclosure.

Shown in FIG. 5 is a pair of electrode sets 500 manufactured according to the present disclosure. First and second electrode sets 510, 511 with the configuration shown in FIG. 4 are aligned and further machined to provide an ion deflector. The first and second electrode sets 510, 511 may be glued to PCBs 250, 251 prior to aligning and further machining the electrode sets 510, 511. The glue may be conductive glue. One or more ridges 460 separate electrode sets 510, 511 by a predetermined distance when assembled.

FIG. 6 illustrates an exploded view of the ion deflector assembly shown in FIG. 5. This Figure illustrates more clearly how the first and second electrode sets 410, 411 are aligned using the alignment holes 130. Alignment holes 130 are provided in the ridges 460 and PCB 250 to allow alignment of the first and second part-machined electrode sets 400, for example, using dowels or guide pins (not visible). The PCB 250 may also have via holes (vias) to provide electrical contact from the outer surfaces of the PCB 250 to the electrode sets 410, 411, which may be used in combination with the conductive glue.

Figure 8:
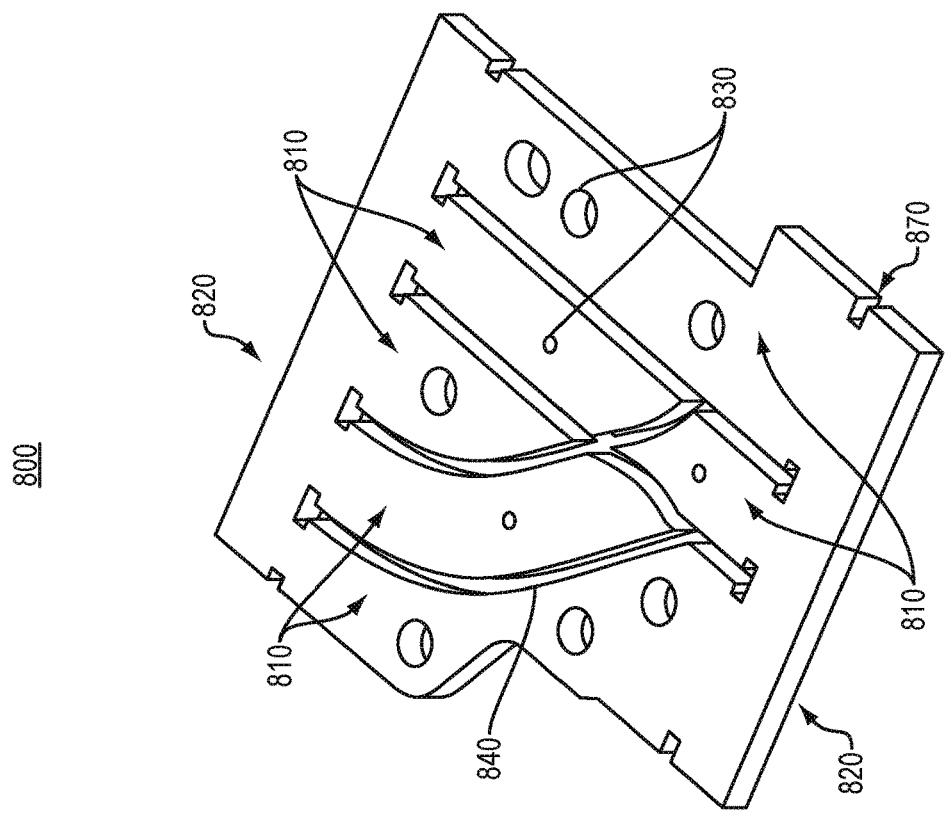
FIG. 8 illustrates a perspective view of a part-machined top electrode set for an ion guide.
Figure 7:
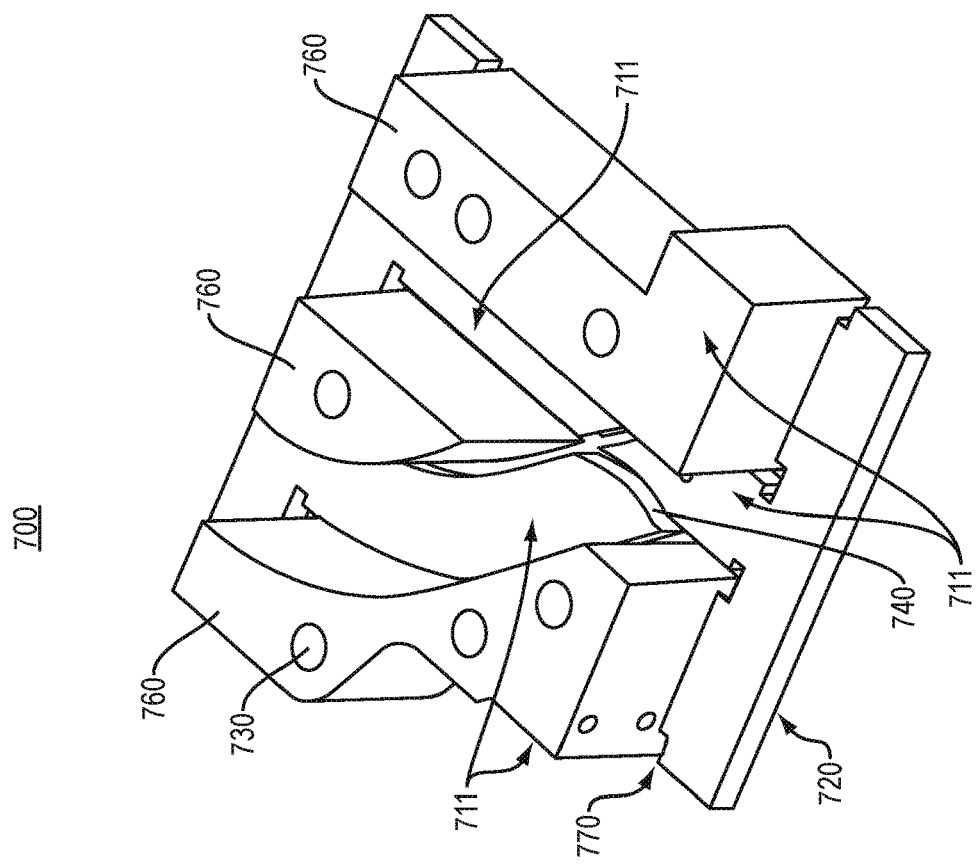
FIG. 7 shows a perspective view of a part-machined bottom electrode set for an ion guide.

FIGS. 7 and 8 show part-machined electrode sets 700, 800 for manufacturing a Y-splitter (also termed a Y-shaped multipole). A Y-splitter is a branched multipole through which ions can be alternatively directed. The branches of the multipole are provided by machined features 740, 840. The electrode sets 711, 810 and guide holes 730, 830 may be machined using wire-erosion or by milling. The guide holes 730, 830 may be the same size or different sizes.

The part-machined electrode set 700, 800 may be flat or may include one or more ridges 760. One or more ridges 760 may separate first and second electrode sets 711, 810 by a pre-determined distance when assembled. In the embodiment shown in FIG. 7, the electrode set 711 is a bottom electrode set 711 and includes ridges 760. In the embodiment in FIG. 8, the electrode set 810 is a top electrode set 810 and is flat. It should be understood that a bottom part-machined electrode may instead be flat and a top part-machined electrode may include ridges 760.

Guide holes 730, 830 are machined (by milling or wire-erosion, for example) in the top and bottom part-machined electrode sets 700, 800. The guide holes 730, 830 on the top and bottom part-machined electrode sets 700, 800 correspond such that the guide holes 830 on the top part-machined electrode set 800 align with the guide holes 730 on the bottom part-machined electrode set 700 when assembled together. The guide holes 730, 830 may be machined during the step of part-machining the electrode sets 711, 810. The method may further include machining a marker 770, 870 to indicate along which axis the step of further machining should be performed. The marker 770, 870 may additionally or alternatively indicate the part of the material that forms the frame part 720, 820 to be removed in the step of further machining. The marker 770, 870 may be machined during the step of part-machining the electrode sets 711, 810.

Figure 9:
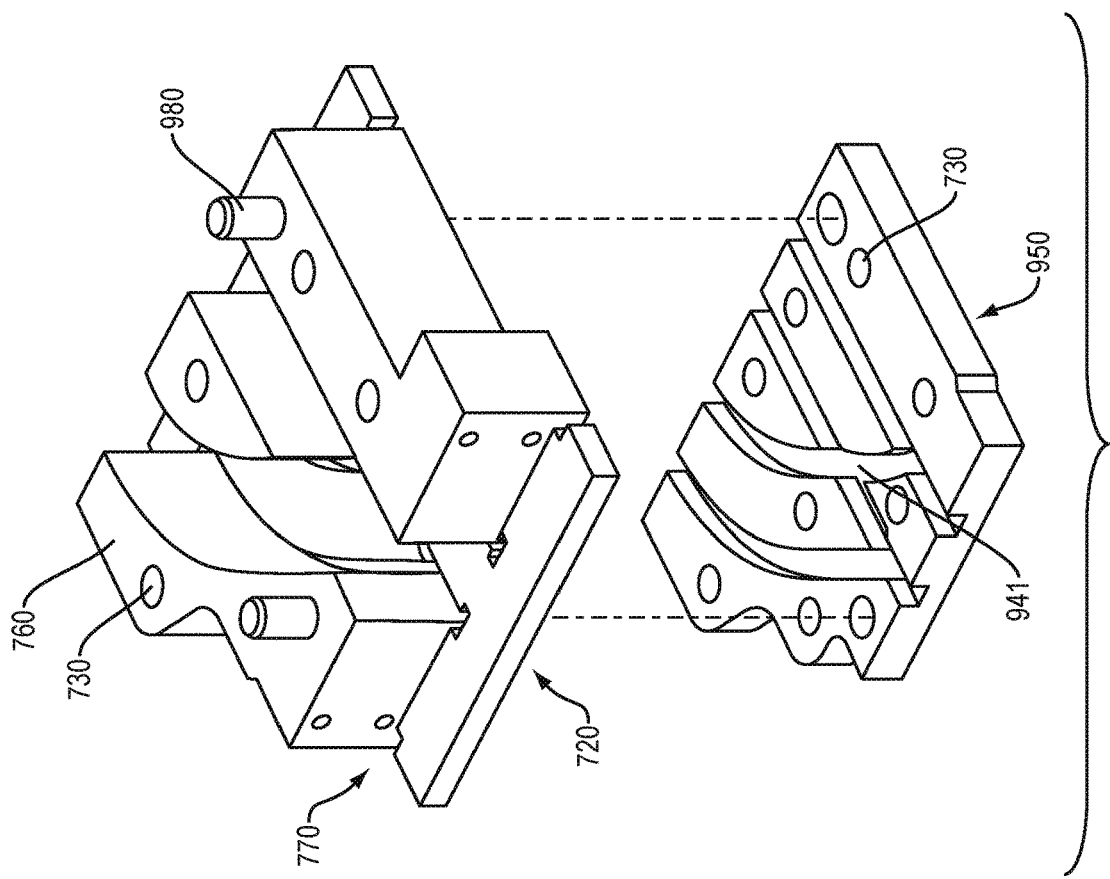
FIG. 9 illustrates an exploded view of the part-machined bottom electrode set bonded to a printed circuit board (PCB)

FIG. 9 illustrates an exploded view of a bottom part-machined electrode set 700 bonded to a PCB 950. The part-machined electrode set 700 may be bonded to the PCB 950 using conductive glue and aligned using guide pins 1081 or dowels 980. The PCB 950 includes alignment holes 730 corresponding to those on the bottom part-machined electrode set 700. The PCB 950 may be shaped and slotted to correspond to the shape and machined features of the part-machined electrode set 700 to which it is glued. For example, the PCB 950 may include slots 941 corresponding to machined features 740.

Figure 10:
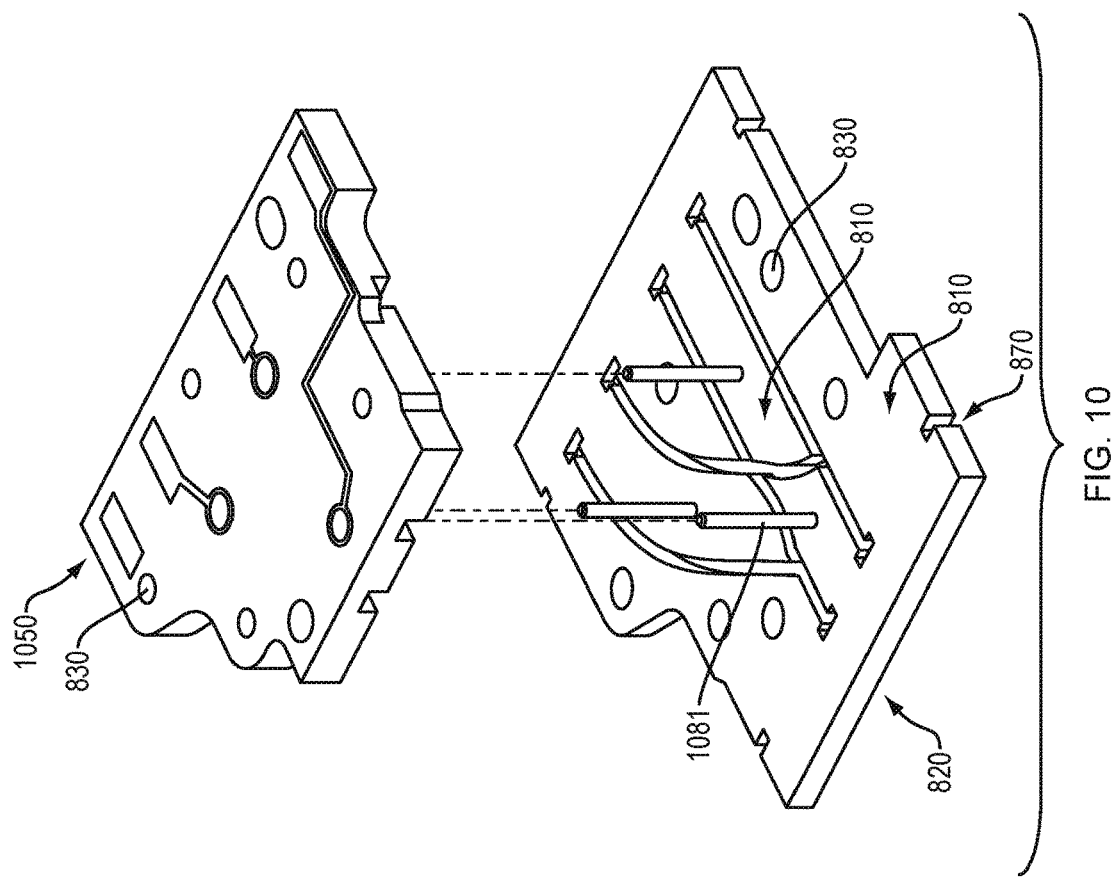
FIG. 10 illustrates an exploded view of the part-machined top electrode set bonded to a PCB.

FIG. 10 shows an exploded view of a top part-machined electrode set 800 bonded to a PCB 1050. The part-machined electrode set 800 may be bonded to the PCB 1050 using conductive glue and aligned using guide pins 1081 or dowels 980. The guide pins 1081 may also or instead provide electrical contact to the electrode sets in the final component assembly.

The PCB 1050 includes alignment holes 830 corresponding to those on the top part-machined electrode set 800. The PCB 1050 may be shaped and slotted as described in reference to FIG. 9. For example, the PCB 1050 may include slots (not visible) corresponding to machined features 840.

Figure 11:
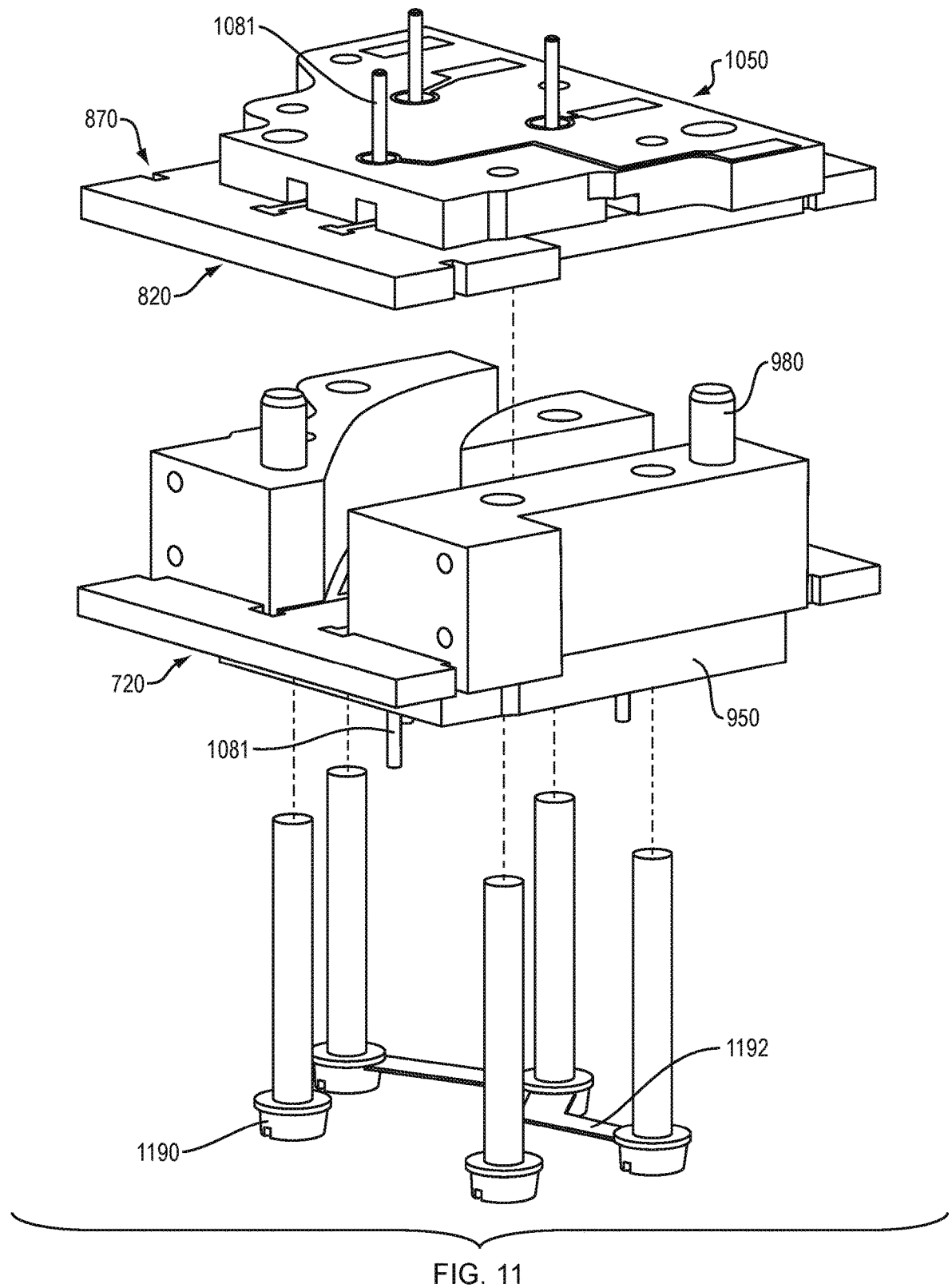
FIG. 11 shows a perspective view of the aligned part-machined top and bottom electrode sets.

FIG. 11 shows an exploded view of the top and bottom part-machined electrode sets 700, 800 aligned using guide pins 1081 and dowels 980. The electrode sets 700, 800 may be alternatively aligned using only dowels 980 or only guide pins 1081. When not used for aligning, the guide pins 1081 may still be present to provide electrical contact to the electrode sets in the final component assembly.

FIG. 11 further shows how screws 1190 are provided for screwing together the part-machined top and bottom electrode sets 700, 800. An electrical connection 1192 may be provided between some or all of the screws 1190.

Figure 12:
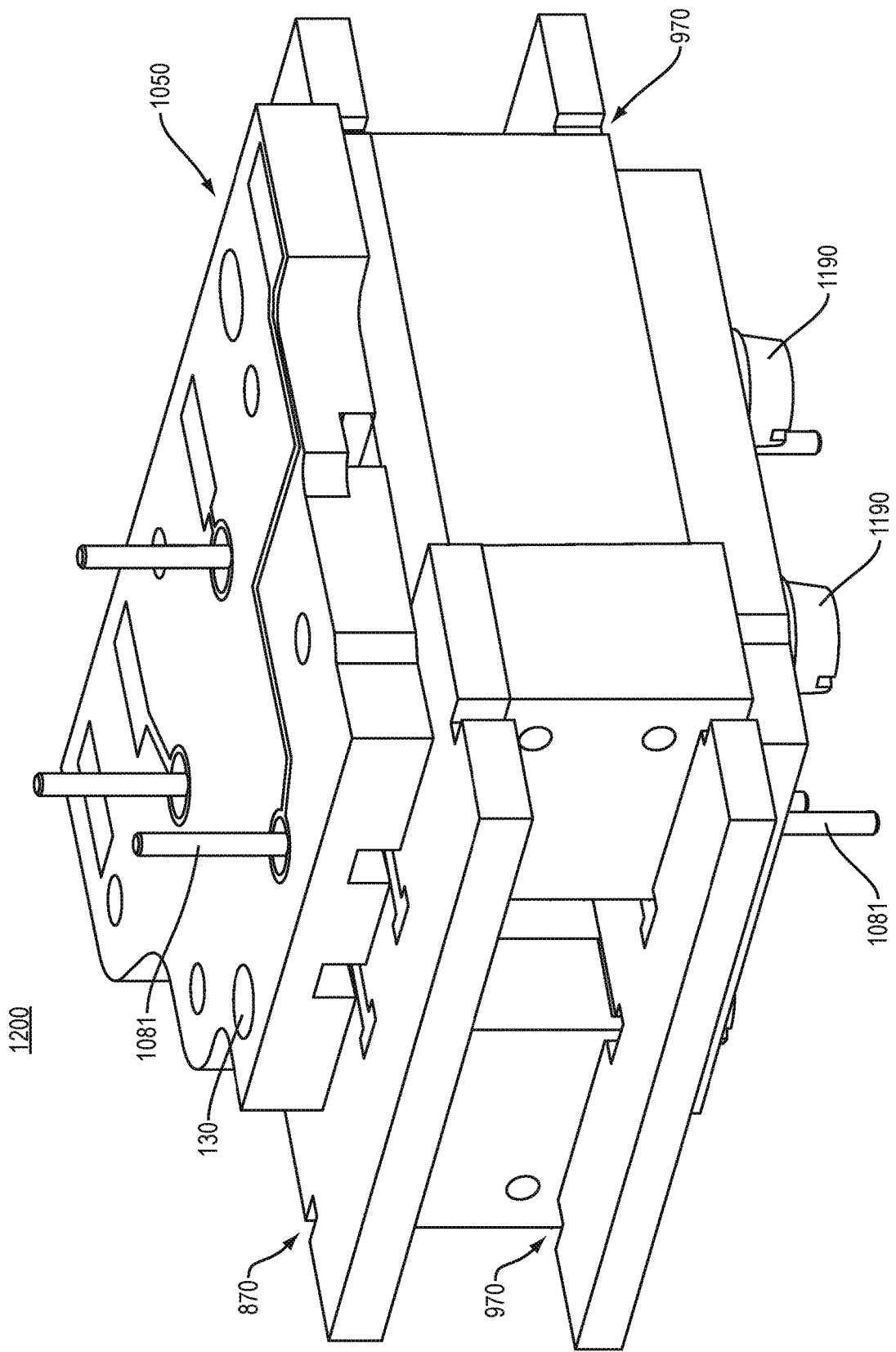
FIG. 12 illustrates an exploded view of the aligned part-machined top and bottom electrode sets of FIG. 11.

As shown in FIG. 12, the top and bottom part-machined electrode sets 700, 800 (for example, as shown in FIGS. 9 and 10) are screwed together with screws 1190 and aligned with guide pins 1081. Dowels 980 may also be used in the alignment step. The ends of the screws 1190 may extend though alignment holes 130 in the PCB 1050. An assembly of the aligned electrode sets 700, 800 and PCBs 950, 1050 may be referred to as an electrode-PCB unit 1200.

Figure 13:
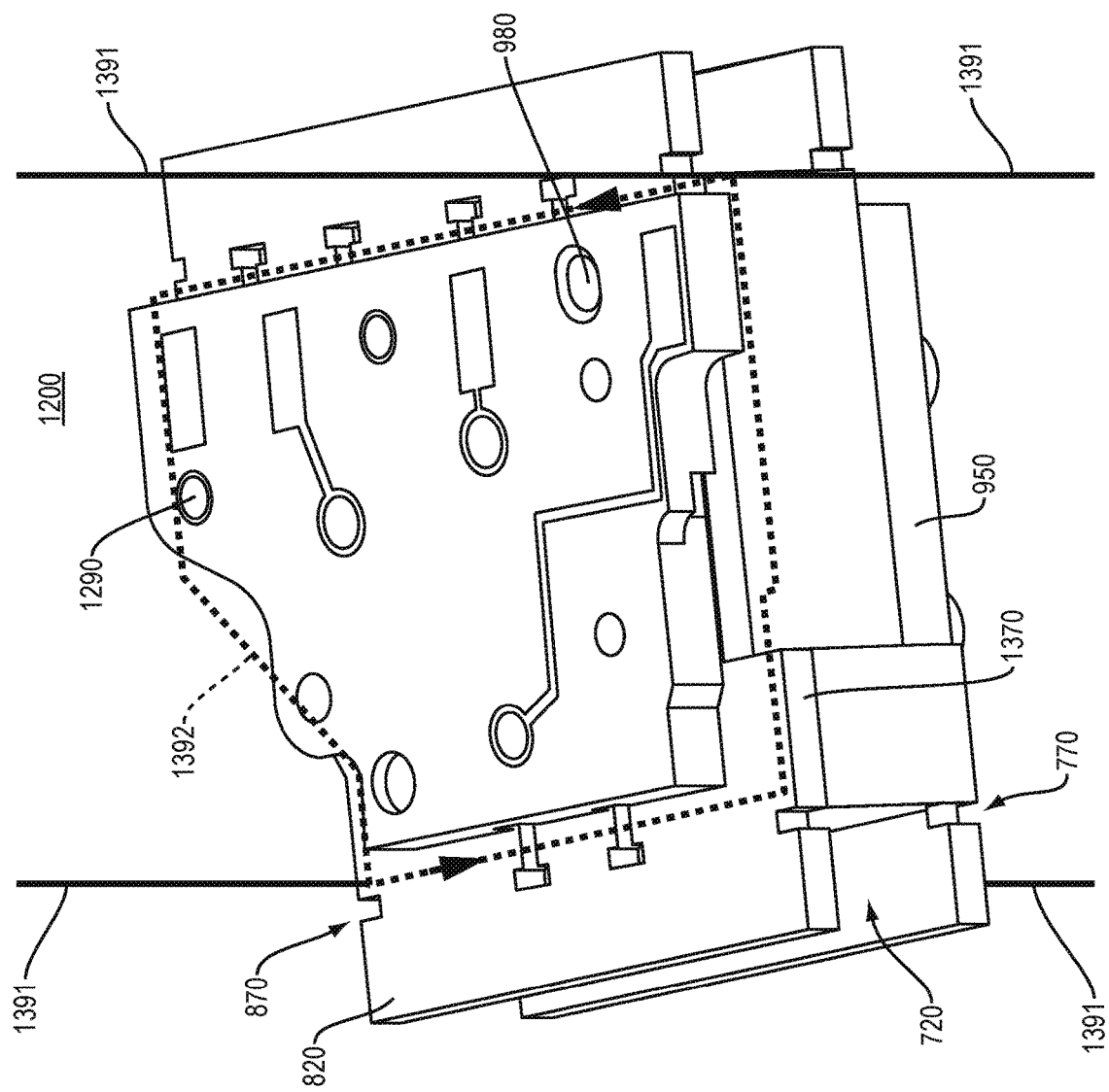
FIG. 13 shows another perspective view of the aligned part-machined top and bottom electrode sets prior to a step of further machining the electrode sets.

FIG. 13 shows first and second part-machined electrode sets aligned and glued to PCBs 1350, 1351 to form an electrode-PCB unit 1200. Steps of further machining are performed using wire-erosion, for example, to separate the first and second part-machined electrode sets 700, 800 from the frame parts 720, 820 of the first and second materials, respectively. The steps of further machining may advantageously occur simultaneously, thereby providing first and second electrode sets 711, 810 that are aligned with higher accuracy and consistency than by using conventional methods.

An example wire path 1392 for the step(s) of further machining is shown in FIG. 13. The step(s) of further machining separate the part-machined electrode sets 700, 800 from their respective frame parts 720, 820. As illustrated in FIG. 13, the step(s) of further machining may include machining an outer alignment feature 1370. The outer alignment feature 1370 may be used to align the assembled component, which may be an ion guide (specifically, a Y-splitter in FIG. 13) to an external holder.

Advantageously, the outer alignment feature 1370 allows the component to be aligned to the external holder with higher accuracy than using conventional methods. Normally, alignment to an external holder is done by using further guide pins and/or supports. The accuracy of alignment in the present disclosure may be ±0.01 mm.

An initial direction of a cut performed by wire-erosion is shown in FIG. 13. In FIG. 13, one or more wires 1391 are provided in a direction perpendicular to the initial cut direction. The one or more wires 1391 may alternatively be at a small angle to the perpendicular. This angle may be, for example, 15 degrees. The angle may alternatively be less than 15 degrees.

As shown in FIG. 13, the marker 770, 870, described in relation to FIGS. 7 and 8, may be present on more than one frame part 720, 820 of a part-machined electrode set 700, 800.

Figure 14:
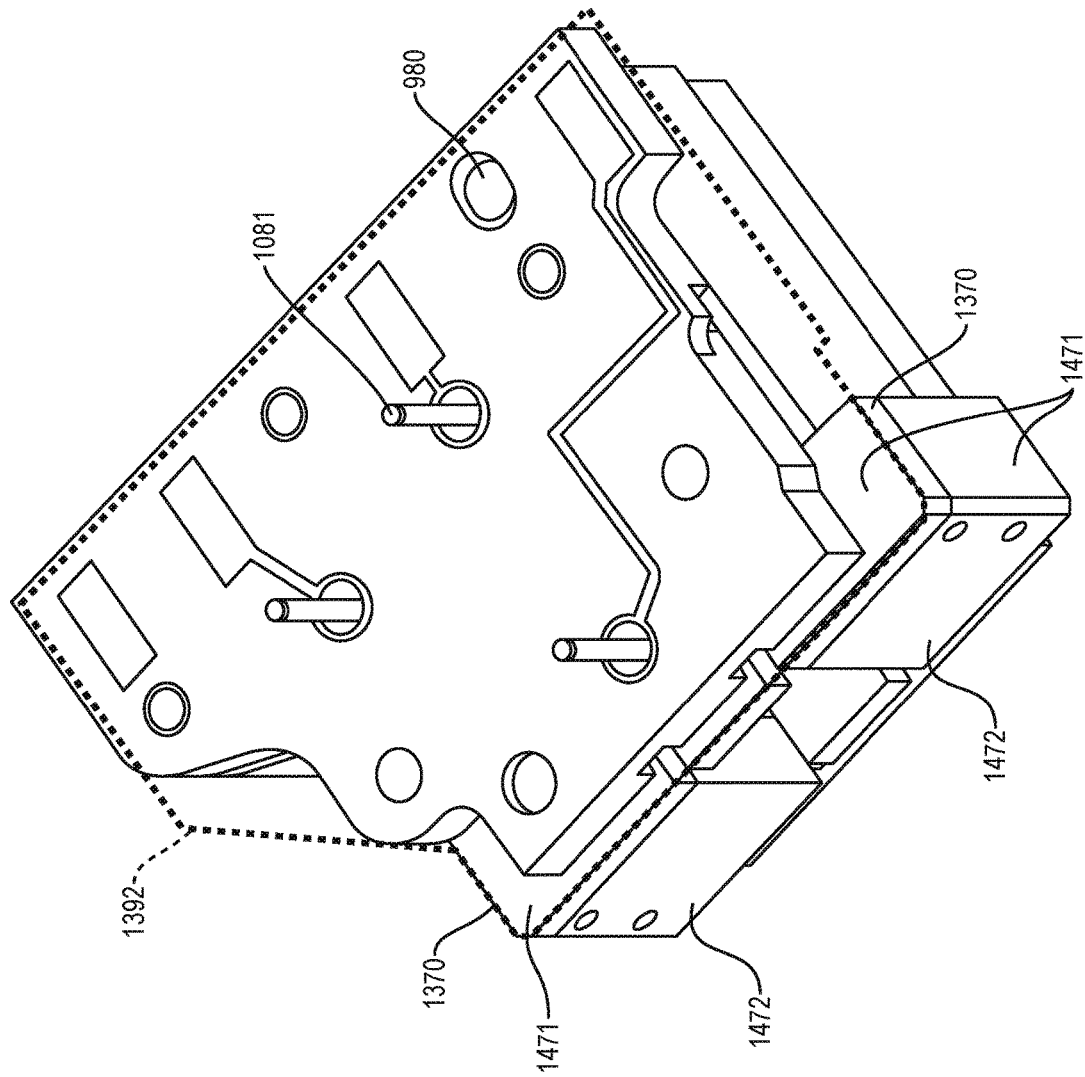
FIG. 14 illustrates a perspective view of the aligned part-machined top and bottom electrode sets following the step of further machining the electrode sets.

FIG. 14 illustrates the electrode-PCB unit 1200 shown in FIG. 13 following a step of further machining. As described in relation to FIG. 13, the step of further machining may include a step of machining one or more outer alignment surfaces 1370, 1471, 1472. For example, one or more alignment surface 1472 may be provided as a hard stop. One or more alignment surfaces 1471 may also or instead be provided on the outer surfaces of the electrode sets 700, 800. Alternatively or additionally, one or more alignment features 1370 may be provided as an edge of the electrode sets 700, 800. FIG. 14 illustrates an embodiment in which each of these types of alignment surface 1370, 1471, 1472 is provided.

Figure 15:
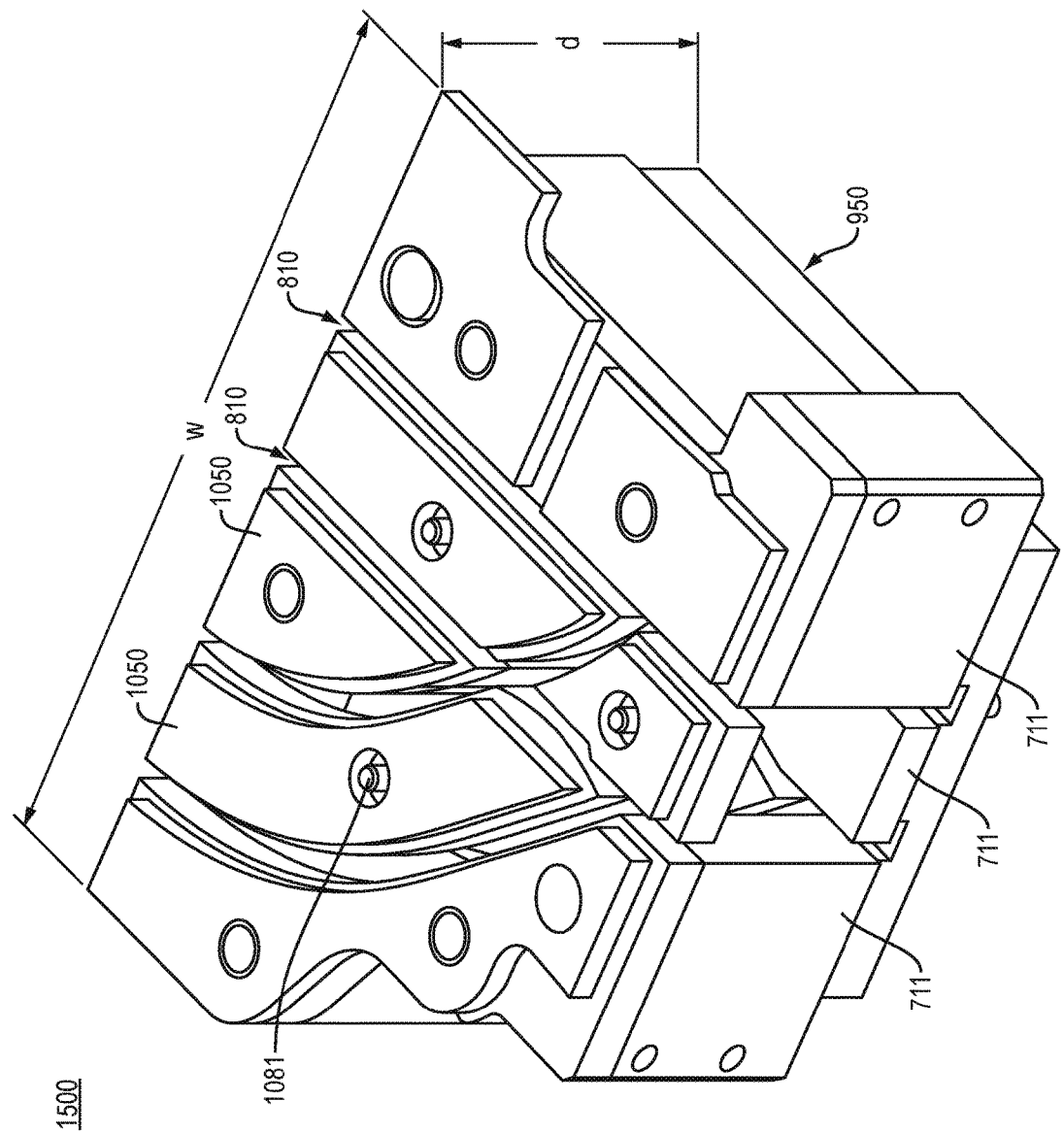
FIG. 15 illustrates another view of the aligned part-machined top and bottom electrode sets following the step of further machining the electrode sets.

FIG. 15 shows the assembly of the first and second electrode sets 711, 810 in a Y-splitter following the steps of further machining. The top electrode set 810 has been separated into six electrodes 810 following the steps of further machining (the PCB 1050 has been separated into seven parts). The bottom electrode set 711 has also been separated into six electrodes (not visible). RF potentials may be applied to the electrodes 711, 810 to direct ions along one or more branches of the Y-splitter.

The assembly 1500 has a final width w and a depth d. The width w may be no more than 41 mm. The depth d may be no more than 19 mm.

Figure 16:
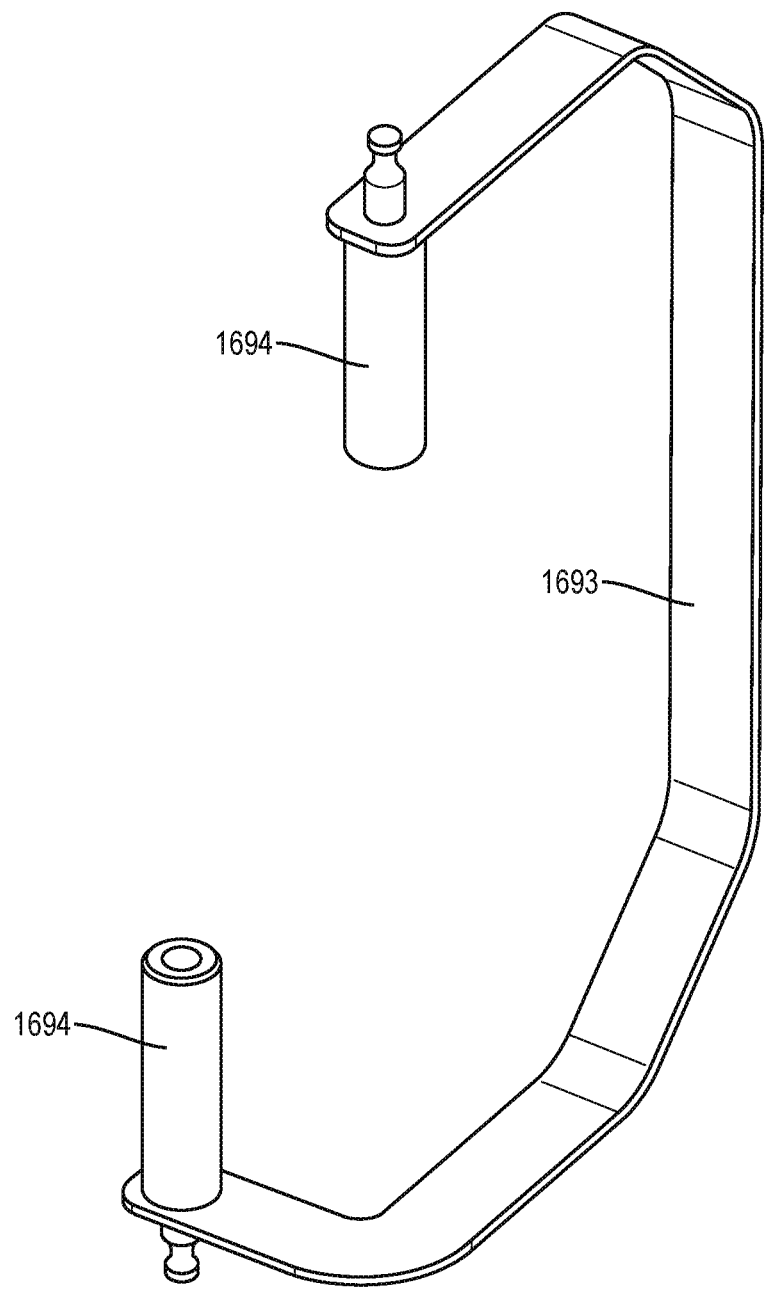
FIG. 16 shows a contact that may be connected to a first and second electrode set in a final ion guide assembly.

Contacts 1694 are shown in FIG. 16. The contacts 1694 may be soldered to a connector 1693. Alternatively, laser spot-welding may be used. The connector 1693 may preferably be made of stainless steel. In the case where the connector 1693 is made of stainless steel and soldered to the contacts 1694, solder suitable for stainless steel parts should be used. For example, ARAX 96S wire produced by Multicore® or S SN96Ag4 ARAX wire produced by Stannol® or an equivalent solder wire may be used.

Figure 17:
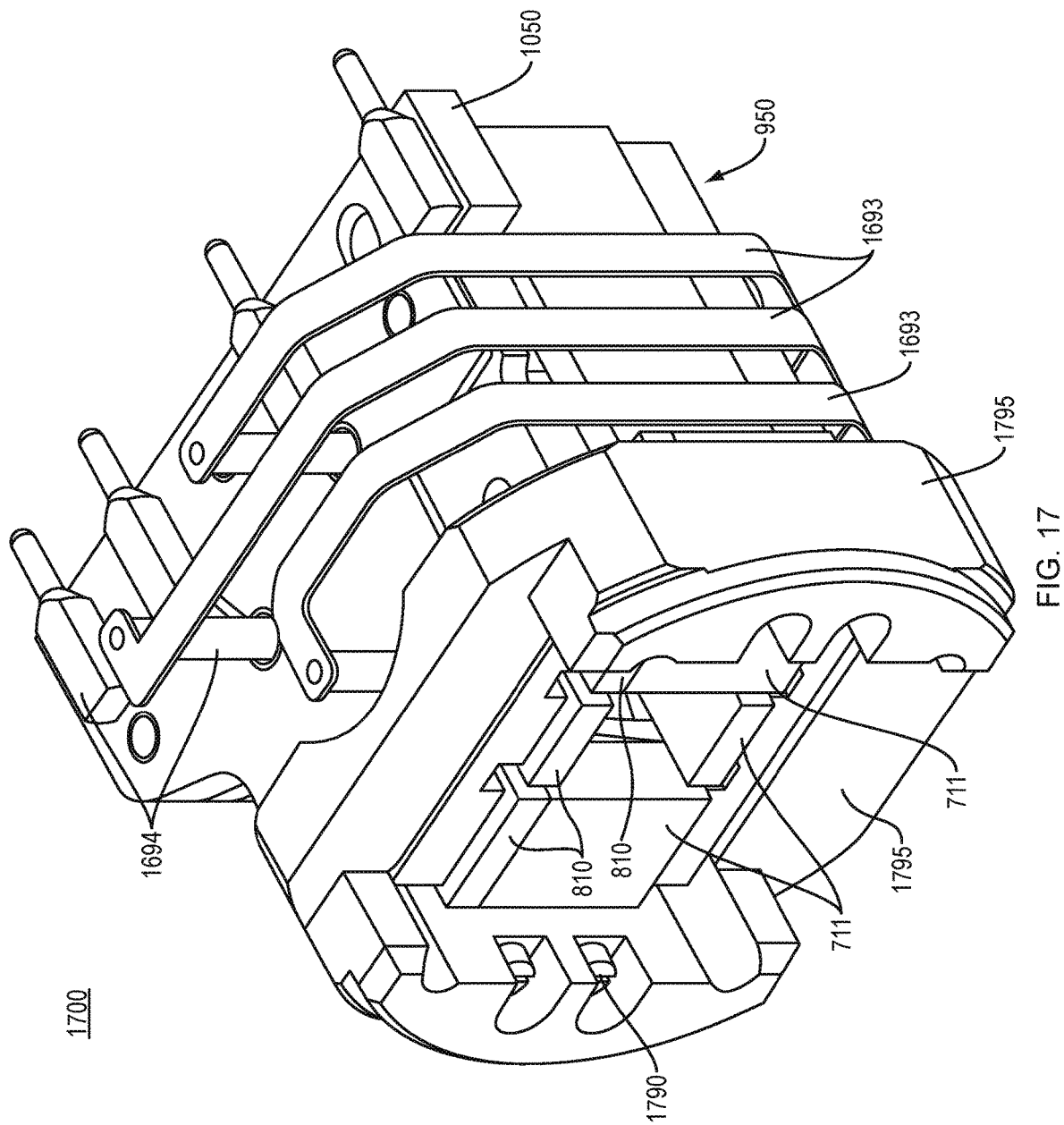
FIG. 17 illustrates a final ion-guide assembly.

FIG. 17 shows a final assembly of a component 1700 of an ion optical device comprising a Y-splitter. The Y-splitter is assembled into a dielectric holder 1795, which may be achieved by assembling the holder 1795 onto an alignment feature 270 or surface 270 on at least one of the electrode sets 711, 810. Screws 1790 may then fix the electrode-PCB unit 1200 to the dielectric holder 1795.

The dielectric may be or (substantially) comprise polyether ether ketone (PEEK). Contacts 1694 and wiring are added to the holder. Contacts 1694 may fit over guide pins 1081 (not visible in FIG. 17). The steps of assembling the electrode sets 711, 810 into a holder 1795 and assembling the wiring and contacts 1694 may be performed in any order (i.e. assembly of the contacts 1694 and wiring may be performed prior to or after assembling the electrode sets 711, 810 into the dielectric holder 1795).

Figure 18:
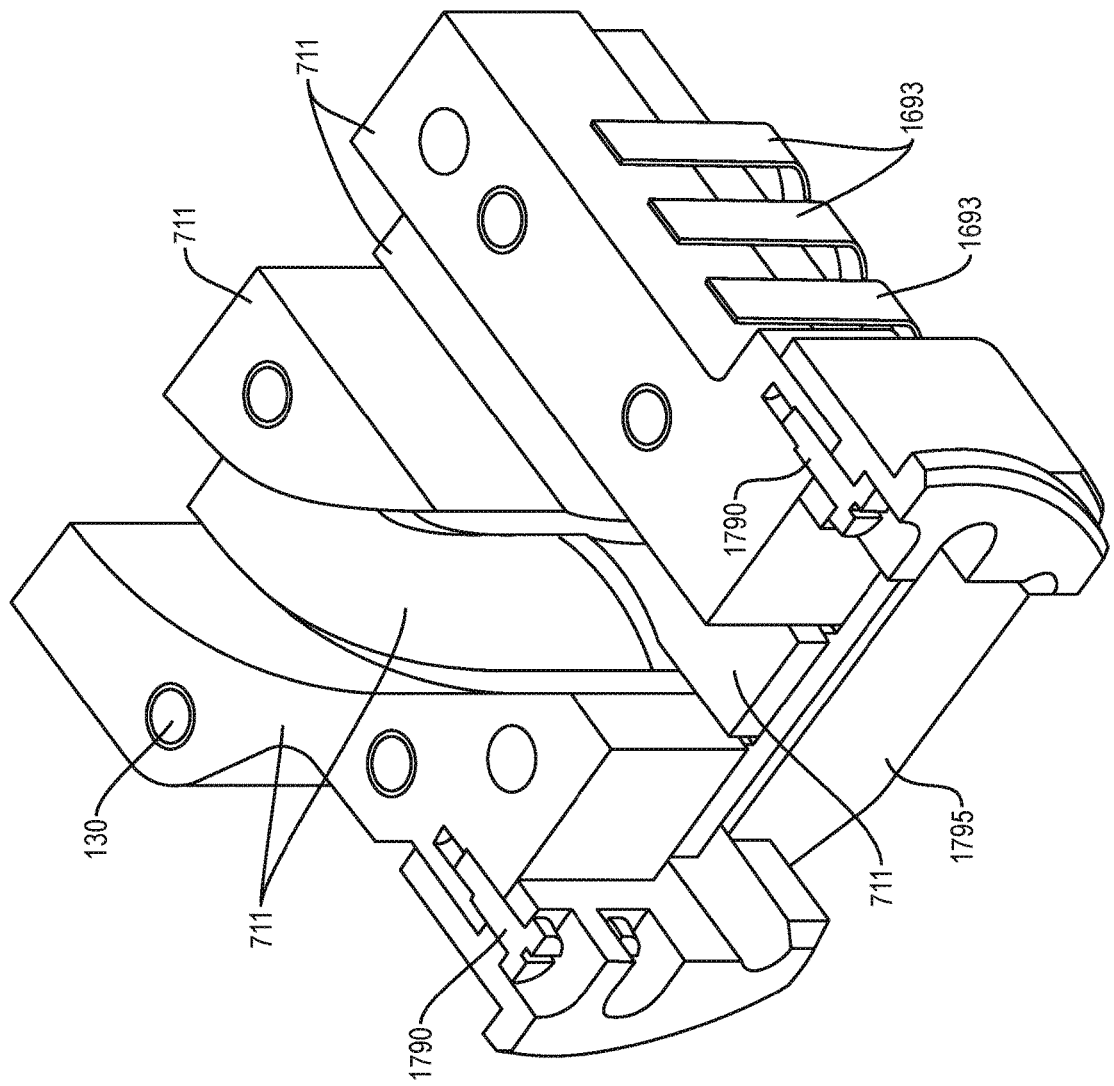
FIG. 18 shows a cross-sectional view of the ion guide assembly of FIG. 17.

FIG. 18 illustrates a cross-sectional view of a final assembly of the component 1700. An alignment surface 270 may be provided to assemble the electrode sets 711, 810 into the dielectric holder.

Radio frequency (RF) voltages may be applied to the electrode sets 711, 810. For example, a positive RF voltage may be applied to the raised electrodes of the electrode set 711 in FIG. 18. A negative RF voltage may be applied to the stem electrode of the electrode set 711 shown in FIG. 18. The branch electrodes of the electrode set 711 may have RF voltage values set to guide ions down one of the branches rather than the other. For example, one of the branch electrodes 711 may have a positive RF voltage applied to it, whilst another branch electrode 711 may have a negative RF voltage applied.

Figure 19:
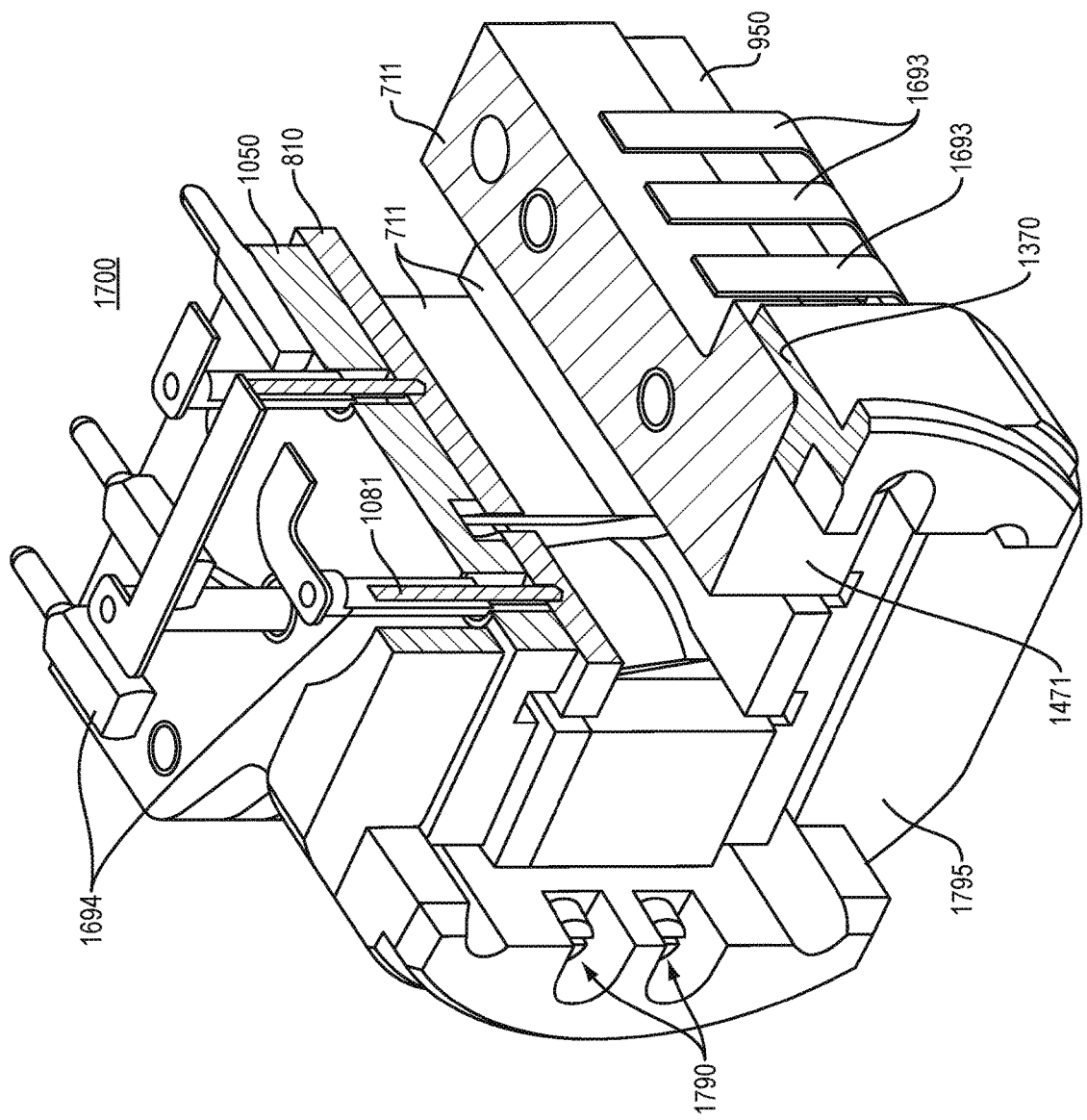
FIG. 19 shows another cross-sectional view of the ion guide assembly of FIG. 17.

Another cross-sectional view of the ion guide assembly 1700 is shown in FIG. 19. The Y-splitter is assembled into a dielectric holder 1795, which may be achieved by assembling the holder onto one or more alignment surfaces 1370, 1471, 1472 on at least one of the electrode sets 711, 810. This is illustrated in FIG. 19 (alignment surface 1472 is not visible). Screws 1790 may then fix the electrode-PCB unit to the dielectric holder 1795.

The dielectric may be or (substantially) comprise polyether ether ketone (PEEK). Contacts 1694 and wiring are added to the holder. The steps of assembling the electrode sets 711, 810 into a holder and assembling the wiring and contacts 1694 may be performed in any order (i.e. assembly of the contacts 1694 and wiring may be performed prior to or after assembling the electrode sets 711, 810 into the dielectric holder).

Figure 20:
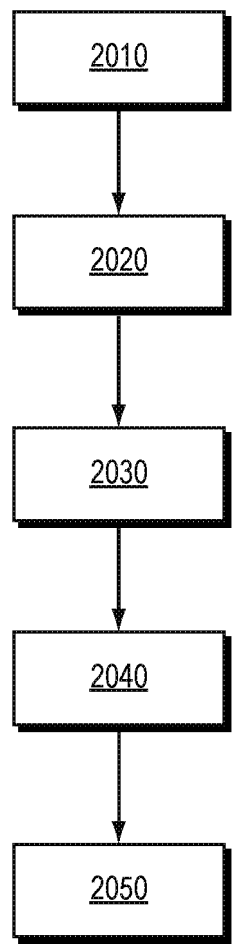
FIG. 20 shows a flowchart of a method for manufacturing a component of an ion optical device.

FIG. 20 shows a flowchart of a method for assembling a component of an ion optical device. At step 2010, a first material is machined to provide a part-machined first electrode set 100, 400. The part-machined first electrode set 100, 400 comprises the first electrode set 110, 410 attached to a frame part of the first material 120, 420. At step 2020, a second material is machined to provide a part-machined second electrode set 100, 400 comprising the second electrode set 110, 410 attached to a frame part 120, 420 of the second material. The first and second materials may be the same material or different materials. The component is assembled at step 2030 by aligning the part-machined first and second electrode sets 100, 400. A step 2040 of further machining is performed following the step of aligning 2030. The step 2040 of further machining separates the first electrode set 110, 410 from the frame part 120, 420 of the first material. At step 2050, the part-machined second electrode set 100, 400 is further machined to separate the second electrode set 110, 410 from the frame part 120, 420 of the second material. Steps 2040 and 2050 may be performed simultaneously.

Figure 21:
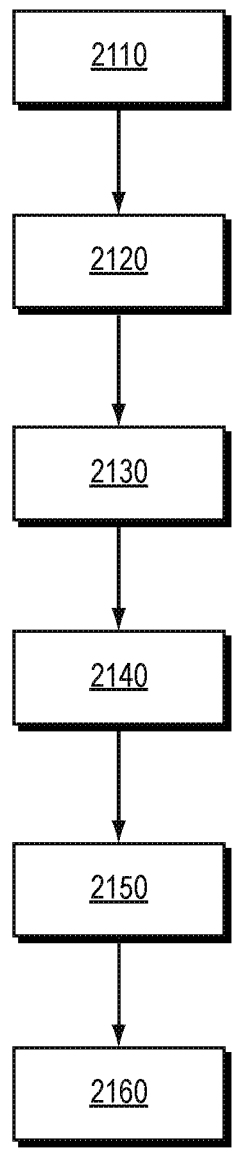
FIG. 21 illustrates a flowchart of a method for manufacturing a component of an ion optical device.

FIG. 21 illustrates a flowchart of a method for assembling a component of an ion optical device. At step 2110, a first material is machined to provide a part-machined first electrode set 100, 400 and a second material is machined to provide a part-machined second electrode set 100, 400. The part-machined electrode sets 100, 400 comprise electrode sets 110, 410 attached to a frame part 120, 420 of the respective materials. The first and second materials may be the same.

At step 2120, the first part-machined electrode set 100, 400 is glued to a first printed circuit board 250 and the second part-machined electrode is glued to a second printed circuit board 251. Following step 2120, the component is assembled by aligning the part-machined first and second electrode sets 100, 400 at step 2130. Step 2140 comprises further machining the part-machined first and second electrode sets 100, 400. Further machining may be performed by wire-erosion.

At step 2150, contacts 1693 and wiring are added to a holder 1795 for the electrode sets 110, 410. The holder is made of a dielectric material, which may be PEEK. At step 2160, the electrode-PCB unit is assembled into the dielectric holder 1795. Steps 2150 and 2160 may be performed in the opposite order to that shown in FIG. 21 (i.e. step 2160 may occur before step 2150).

Although embodiments according to the disclosure have been described with reference to particular types of devices and applications (particularly mass spectrometers) and the embodiments have particular advantages in such case, as discussed herein, approaches according to the disclosure may be applied to other types of device and/or application. The specific manufacturing details of the ion optical device (such as an ion guide) and/or ion optical system, whilst potentially advantageous (especially in view of known manufacturing constraints and capabilities), may be varied significantly to arrive at devices with similar or identical operation. Each feature disclosed in this specification, unless stated otherwise, may be replaced by alternative features serving the same, equivalent or similar purpose. Thus, unless stated otherwise, each feature disclosed is one example only of a generic series of equivalent or similar features.

For example, although steps of machining and further machining have been described with reference to wire-erosion, other methods may be used to detach electrode sets from materials and/or to form guide holes. For example, a thermal cutting process, such as flame cutting, plasma cutting or laser cutting may be used. In another example, chemical etching or form erosion may be used. In a further example, a waterjet or abrasion jet may be used to detach electrode sets and/or to form guide holes. In yet another example, guide holes may be machined by drilling or hole-punching.

The methods and apparatus of the present disclosure can be utilised with a variety of electrode structures. Electrodes of appropriate dimensions can be arranged into symmetrical or asymmetrical patterns upon substrates and if elongation of electrodes is beneficial for a particular application, the electrodes may be linear or curving. Individual electrodes can be hemispherical, rectangular or of other shapes.

All of the aspects and/or features disclosed in this specification may be combined in any combination, except combinations where at least some of such features and/or steps are mutually exclusive. In particular, the preferred features of the disclosure are applicable to all aspects and embodiments of the disclosure and may be used in any combination. Likewise, features described in non-essential combinations may be used separately (not in combination).

As used herein, including in the claims, unless the context indicates otherwise, singular forms of the terms herein are to be construed as including the plural form and vice versa. For instance, unless the context indicates otherwise, a singular reference herein including in the claims, such as "a" or "an" (such as a pair of electrode sets) means "one or more" (for instance, one or more pairs of electrode sets). Throughout the description and claims of this disclosure, the words "comprise", "including", "having" and "contain" and variations of the words, for example "comprising" and "comprises" or similar, mean "including but not limited to", and are not intended to (and do not) exclude other components.

The use of any and all examples, or exemplary language ("for instance", "such as", "for example" and like language) provided herein, is intended merely to better illustrate the disclosure and does not indicate a limitation on the scope of the disclosure unless otherwise claimed. No language in the specification should be construed as indicating any non-claimed element as essential to the practice of the disclosure.

The terms "first" and "second" may be reversed without changing the scope of the invention. That is, an element termed a "first" element may instead be termed a "second" element and an element termed a "second" element may instead be considered a "first" element. Likewise, the terms "top" and "bottom" are not intended to be limiting and a "top" element may instead be termed a "bottom" element and vice versa.

Any steps described in this specification may be performed in any order or simultaneously unless stated or the context requires otherwise. Moreover, where a step is described as being performed after a step, this does not preclude intervening steps being performed.

It is also to be understood that, for any given component or embodiment described herein, any of the possible candidates or alternatives listed for that component may generally be used individually or in combination with one another, unless implicitly or explicitly understood or stated otherwise. It will be understood that any list of such candidates or alternatives is merely illustrative, not limiting, unless implicitly or explicitly understood or stated otherwise.

The invention claimed is:

1. A method of manufacturing a component of an ion optical device, the component comprising aligned first and second electrode sets, the method comprising steps of:
    machining a first material to provide a part-machined first electrode set that comprises the first electrode set attached to a frame part of the first material;
    machining a second material to provide a part-machined second electrode set that comprises the second electrode set attached to a frame part of the second material;
    assembling the component of the ion optical device by aligning the part-machined first and second electrode sets; and
    subsequent to aligning the part-machined first and second electrode sets:
        further machining the part-machined first electrode set to separate the first electrode set from the frame part of the first material; and
        further machining the part-machined second electrode set to separate the second electrode set from the frame part of the second material.

2. The method of claim 1, wherein the steps of further machining are performed simultaneously.

3. The method of claim 1, wherein the steps of machining are performed by one of: wire-erosion; form erosion; chemical etching; waterjet cutting; and thermal cutting.

4. The method of claim 1, wherein the steps of further machining are performed by one of: wire-erosion; form erosion; chemical etching; waterjet cutting; and thermal cutting.

5. The method of claim 1, wherein the first electrode set comprises a first electrode and/or the second electrode set comprises a second electrode.

6. The method of claim 1, wherein the first electrode set comprises a first plurality of electrodes and/or the second electrode set comprises a second plurality of electrodes.

7. The method of claim 1, wherein the step of machining a first material and/or the step of machining a second material includes machining shaping features to provide a segmented electrode set following the further machining step.

8. The method of claim 1, wherein the step of machining a first material and/or the step of machining a second material includes machining features to provide a shaped electrode set following the further machining step.

9. The method of claim 1, wherein the first and second materials are the same material.

10. The method of claim 1, wherein the component of the ion optical device is an ion guide or an ion deflector.

11. The method of claim 10, wherein the component is an ion guide and the ion guide is a Y-shaped multipole.

12. The method of claim 1, wherein the part-machined first and second electrode sets are aligned using dowels and/or guide pins.

13. The method of claim 12, wherein guide holes for the dowels and/or guide pins are provided during the steps of machining.

14. The method of claim 1, wherein the steps of further machining include machining an outer alignment feature for aligning the component to an external holder.

15. The method of claim 1, wherein, prior to the step of assembling the component,
    the first electrode set is glued to a printed circuit board, PCB; and/or
    the second electrode set is glued to a PCB.

16. The method of claim 15, wherein the steps of machining are performed by wire-erosion, and wherein a wire for the wire-erosion has a cutting direction in which a cut of the machining takes place and wherein the wire is at an angle to a plane perpendicular to the cutting direction of no more than 15 degrees.

17. The method of claim 16, wherein the angle is 0 degrees.

* * * * *